(12) United States Patent
Luo

(10) Patent No.: US 12,081,209 B2
(45) Date of Patent: Sep. 3, 2024

(54) CHANNEL CIRCUIT AND ELECTRONIC DEVICE

(71) Applicant: Shanghai Yaohuo Microelectronics Co., Ltd., Shanghai (CN)

(72) Inventor: Yongjin Luo, Shanghai (CN)

(73) Assignee: Shanghai Yaohuo Microelectronics Co., Ltd., Shanghai (CN)

( * ) Notice: Subject to any disclaimer, the term of this patent is extended or adjusted under 35 U.S.C. 154(b) by 87 days.

(21) Appl. No.: 17/985,492

(22) Filed: Nov. 11, 2022

(65) Prior Publication Data

US 2023/0170899 A1    Jun. 1, 2023

(30) Foreign Application Priority Data

Nov. 26, 2021    (CN) .......................... 202111422184.7

(51) Int. Cl.
*H03K 17/687* (2006.01)
*H03K 5/24* (2006.01)

(52) U.S. Cl.
CPC ........... *H03K 17/6871* (2013.01); *H03K 5/24* (2013.01)

(58) Field of Classification Search
CPC ...... H03K 17/6871; H03K 5/24; H03K 17/20; H03K 17/567; G06F 1/22; G06F 1/28
See application file for complete search history.

(56) References Cited

FOREIGN PATENT DOCUMENTS

JP           6525354 B2 *   6/2019

* cited by examiner

*Primary Examiner* — Metasebia T Retebo
(74) *Attorney, Agent, or Firm* — Zhu Lehnhoff LLP

(57) ABSTRACT

Disclosed area channel circuit and an electronic device, including a power channel switch, a signal channel switch, a control module, and a comparison module. The power channel switch is connected between a circuit input end and a first circuit output end, and the signal channel switch is connected between the circuit input end and a second circuit output end. The comparison module is connected to the circuit input end and is configured to compare an input voltage with a specified voltage threshold, including a first voltage threshold, and feedback corresponding comparison results to the control module. The control module is configured to turn on the signal channel switch and turn off the power channel switch when the input voltage is lower than the first voltage threshold, and to turn on the signal channel switch when the input voltage is higher than the first voltage threshold.

5 Claims, 1 Drawing Sheet

CHANNEL CIRCUIT AND ELECTRONIC DEVICE

The present application claims the priority of Chinese Patent Application No. 202111422184.7, field on Nov. 26, 2021, the disclosure of which is hereby incorporated by reference.

FIELD OF THE INVENTION

The present invention relates to the field of circuit, in particular, to a channel circuit and an electronic device.

BACKGROUND OF THE INVENTION

In an electronic device, there may be a power channel and a signal channel, wherein the power channel refers to the channel for transmitting electrical energy to achieve power supply, and the signal channel refers to the channel that transmits logic level or analog signal level to realize logic level or analog signal level transmission.

In the prior art, the power channel and the signal channel need to use input pins and output pins, respectively, causing the problem of more pins, and further causing problems such as larger occupation area and higher cost.

BRIEF SUMMARY OF THE DISCLOSURE

The invention provides a channel circuit and an electronic device to solve the problem of more pins.

According to the first aspect of the invention, a channel circuit is provided, including a power channel switch, a signal channel switch, a control module, and a comparison module, wherein the power channel switch is connected between a circuit input end and a first circuit output end, and the signal channel switch is connected between the circuit input end and a second circuit output end;

the comparison module is connected to the circuit input end and is configured to compare an input voltage with a specified voltage threshold, and feedback corresponding comparison results to the control module; the specified voltage threshold comprises a first voltage threshold:

the control module is configured to control the signal channel switch to be turned on and the power channel switch to be turned off when the input voltage is lower than the first voltage threshold, and to control the signal channel switch to be turned off when the input voltage is higher than the first voltage threshold.

Optionally, the specified voltage threshold further includes a second voltage threshold; the second voltage threshold is higher than the first voltage threshold;

the control module is further configured to control the power channel switch to be turned on when the input voltage is higher than the first voltage threshold and lower than the second voltage threshold, and to control the power channel switch to be turned off when the input voltage is higher than the second voltage threshold.

Optionally, the second voltage threshold is an overvoltage protection voltage threshold, and the first voltage threshold is an undervoltage protection voltage threshold.

Optionally, the signal channel switch is a bi-directional switch.

Optionally, the control module is further configured to be powered by a specified voltage source when the input voltage is lower than the first voltage threshold.

Optionally, the comparison module includes a first comparison unit configured to compare the input voltage with the first voltage threshold, and the first comparison unit is connected between the circuit input end and the control module.

Optionally, the first comparison unit includes a first divider resistor, a second divider resistor, and a first comparator; the first divider resistor is connected between a first input end of the first comparator and the circuit input end, the second divider resistor is connected between the first input end and the ground, and a second input end of the first comparator is connected to a first reference voltage corresponding to the first voltage threshold.

Optionally, the comparison module includes a second comparison unit configured to compare the input voltage with the second voltage threshold in the specified voltage threshold, and the second comparison unit is connected between the circuit input end and the control module.

Optionally, the second comparison unit includes a third divider resistor, a fourth divider resistor, and a second comparator; the third divider resistor is connected between a first input end of the second comparator and the circuit input end, the fourth divider resistor is connected between a second input end of the second comparator and the ground, and the second input end of the second comparator is connected to a second reference voltage corresponding to the second voltage threshold.

According to the second aspect of the invention, an electronic device is provided, including the channel circuit related to the first aspect and optional solutions thereof.

In the channel circuit and the electronic device provided by the invention, since the signal channel switch and the power channel switch are respectively connected between the circuit input end and the corresponding circuit output end, the signal transmission for the logic level may be realized when the signal channel switch is controlled to be turned off, and the power channel switch is controlled to be turned on, and the transmission for the power may be realized when the signal channel switch is controlled to be turned on, and the power channel switch is controlled to be turned off, so that the transmission for the power and the signal transmission for the logic level may multiplex the circuit input (i.e., IN pin), thereby effectively saving the number of pins and hence saving area and cost. At the same time, in the invention, the transmission for the power and the signal transmission may be switched based on the comparison results between the input voltage and the first voltage threshold, so as to realize the accurate switching of the circuit, thereby accurately adapting to the requirements in the transmission of the circuit.

BRIEF DESCRIPTION OF THE DRAWINGS

In order to illustrate the technical schemes in the embodiments of the present invention or in the prior art more clearly, the drawings which are required to be used in the description of the embodiments or the prior art are briefly described below. It is obvious that the drawings described below are only some embodiments of the present invention. It is apparent to those of ordinary skill in the art that other drawings may be obtained based on the accompanying drawings without inventive effort.

DESCRIPTION OF REFERENCE NUMERALS

Figure 1:
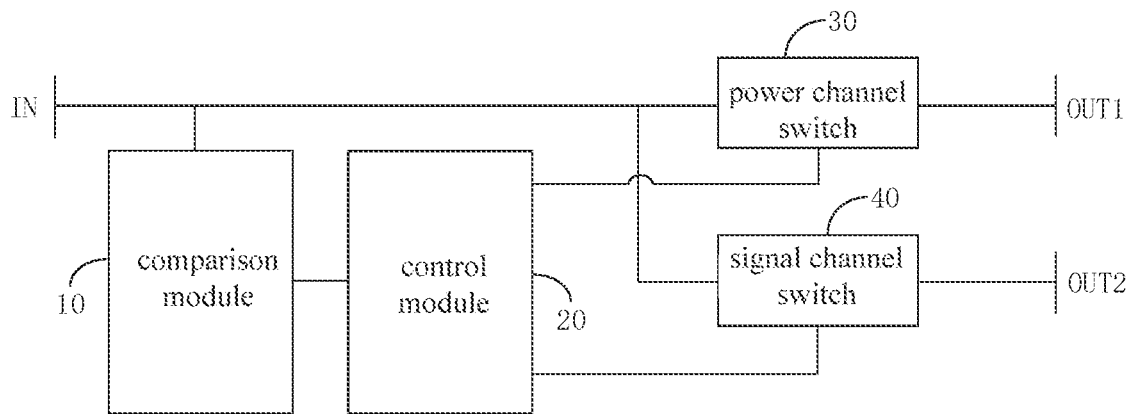
FIG. 1 is a circuit diagram of a channel circuit in an embodiment of the invention.

10—Comparison module;
11—First comparison unit;
12—Second comparison unit,
20—Control module;
30, SW1—Power channel switch;
40, SW2—signal channel switch;
R1—First resistor;
R2—Second resistor;
R3—Third resistor;
R4—Fourth resistor;
Comp1—First comparator;
Comp2—Second comparator.

DETAILED DESCRIPTION OF THE INVENTION

Clear and intact description will be made on technical schemes in the embodiments of the present invention below in combination with drawings in the embodiments of the present invention. Obviously, the described embodiments are merely a part of embodiments of the present invention and are not all the embodiments. Based on the embodiments of the present invention, all the other embodiments obtained by those of ordinary skill in the art without inventive effort are within the scope of the present invention.

In the description of the present invention, it should be noted that orientations or position relationships indicated by terms "upper portion", "lower portion", "upper end", "lower end", "upper surface", "lower surface" and the like are orientations or position relationships shown in the drawings, and these terms are merely for facilitating the description of the present invention and simplifying the description, but not for indicating or implying that the mentioned device or elements must have a specific orientation and must be established and operated in a specific orientation, and thus, these terms cannot be understood as a limitation to the present invention.

In the description of the specification of the present disclosure, the terms "first" and "second" are used only for description and shall not be interpreted as an indication or implication of relative importance or an implicit indication of the number of technical features. Thus, the feature defined by "first" and "second" can explicitly or implicitly include one or more characteristics.

In the description of the present disclosure, the meaning of "a plurality" is multiple, such as two, three, four, etc., unless specifically defined otherwise.

In the specification of the present invention, unless otherwise specified and defined, the terms such as "connected" and the like should be understood in a broad sense. For example, the terms may be fixed connection, detachable connection, or integrated, the terms may be a mechanical connection, electric connection, or communication with each other, and the terms may be direction connection, indirect connection through an intermediate medium, or internal communication of two components or interaction between two components. The ordinary artisans concerned may understand the specific meaning of terms in this disclosure according to the specific circumstances.

The technical solutions of the present invention are described in detail below with reference to the specific embodiments. The following several embodiments may be combined with each other, and the same or similar concept or process may not be described again in some embodiments.

With reference to FIG. 1, an embodiment of the invention provides a channel circuit, which includes a power channel switch 30, a power channel switch 40, a control module 20, and a comparison module 10. The channel circuit may be disposed in the same chip.

The power channel switch 30 is connected between a circuit input end (i.e., IN pin) and a first circuit output end (i.e., OUT1 pin). Further, the transmission of the power between the circuit input end (i.e., IN pin) and the first circuit output end (i.e., OUT1 pin) may be realized by turning on or turning off the power channel switch 30. Further, in an example, the power channel switch 30 may be a transistor, such as a field effect transistor and a triode, or may be implemented with any other device.

The signal channel switch 40 is connected between a circuit input end (i.e., IN pin) and a second circuit output end (i.e., OUT2 pin). Further, the transmission of the logic level or analog signals between the circuit input end (i.e., IN pin) and the second circuit output end (i.e., OUT2 pin) may be realized by turning on or turning off the signal channel switch 40. Further, in an example, the signal channel switch 40 may be a transistor, such as a field effect transistor and a triode, or may be implemented with any other device.

In one example, the control module 20 may be directly connected to control ends of the power channel switch 30 and the signal channel switch 40. In another example, the power channel switch 30 and the signal channel switch 40 may also be connected through a driving module (e.g., a circuit module that realizes driving by controlling the upper and lower transistors). In addition, the number of the power channel switch 30 and the signal channel switch 40 may be one or more.

The comparison module 10 is connected to the circuit input end (e.g., IN pin) and is configured to compare an input voltage with a specified voltage threshold and feedback corresponding comparison results to the control module;

the specified voltage threshold comprises a first voltage threshold; correspondingly, the comparison results include whether the input voltage is higher than the first voltage threshold, and/or whether the input voltage is lower than the first voltage threshold. The first voltage threshold may be, for example, an undervoltage protection voltage threshold, which can be arbitrarily changed according to requirements.

In some examples, the specified voltage threshold further includes a second voltage threshold; correspondingly, the comparison results include whether the input voltage is higher than the second voltage threshold, and/or whether the input voltage is lower than the second voltage threshold. The second voltage threshold may be, for example, an overvoltage protection voltage threshold, which can be arbitrarily changed according to requirements.

The control module 20 is configured to control the signal channel switch to be turned on and the power channel switch to be turned off when the input voltage is lower than the first voltage threshold, and to control the signal channel switch to be turned off when the input voltage is higher than the first voltage threshold.

In the above solutions, since the signal channel switch and the power channel switch are connected between the circuit input end and the corresponding circuit output end, the signal transmission for the logic level or the analog signal level may be realized when the signal channel switch is controlled to be turned off and the power channel switch is controlled to be turned on, and the transmission for the power may be realized when the signal channel switch is controlled to be turned on and the power channel switch is controlled to be turned off, so that the transmission for the power and the signal transmission for the logic or analog signal level may multiplex the circuit input (i.e., circuit input pin), thereby effectively saving the number of pins and hence saving area and cost. At the same time, in the invention, the transmission for the power and the signal transmission may be switched based on the comparison results between the input voltage and the first voltage threshold, so as to realize the accurate switching of the circuit, thereby accurately adapting to the requirements in the transmission of the circuit.

The control module 20 is further configured to control the power channel switch to be turned on when the input voltage is higher than the first voltage threshold and lower than the second voltage threshold, and to control the power channel switch to be turned off when the input voltage is higher than the second voltage threshold.

Obviously, under the control of the control module 20, the power channel switch 30 and the signal channel switch 40 may form at least three states:

when the input voltage is higher than the second voltage threshold, both the power channel switch 30 and the signal channel switch 40 are turned off; at this time, no transmission for the power, the logic level signal, or the analog signal is performed;

when the input voltage is lower than the second voltage threshold and higher than the first voltage threshold, the power channel switch 30 is turned on, and the signal channel switch 40 is turned off; at this time, the transmission for the power may be performed, and when the input voltage is lower than the first voltage threshold, the power channel switch 30 is turned off, and the signal channel switch 40 is turned on; at this time, the transmission for the logic level signal or the analog signal may be performed.

Figure 2:
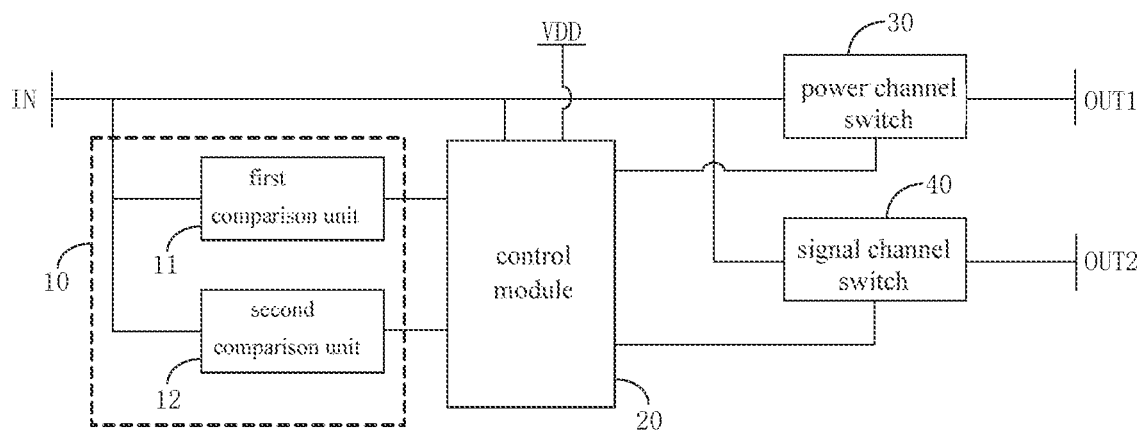
FIG. 2 is a circuit diagram of a channel circuit in another embodiment of the invention.

In an embodiment, with reference to FIG. 2, the control module 20 may be connected to a voltage source (e.g., a voltage source delivered to the VDD pin); further, the control module 20 may be configured to be powered by a specified voltage source when the input voltage is lower than the first voltage threshold.

In a specified example, a voltage of the specified voltage source may or may not be higher than the first voltage threshold. For example, the voltage provided by the specified voltage source itself may be higher than the first voltage threshold, and the specified voltage source may also be lower than the first voltage threshold. If required, the signal path may be powered internally using a boost from a charge pump, etc.

When an input voltage is higher than the first voltage threshold, the control module may be powered by the specified voltage source or by the power input from the IN pin; no matter which method is adopted, it does not deviate from the scope of the embodiments of the invention.

In some solutions, the specified voltage source may be generated by a corresponding power module. For example, the power module may always supply power to the control module 20, or may supply power to the control module only when the input voltage is lower than the first voltage threshold.

Further, in the above solutions, it can be ensured that when the input voltage is lower than the first voltage threshold, the control module may still obtain enough voltage to meet the requirements in power consumption of the control module and/or the requirements in driving the power channel switch 30 and the signal channel switch 40.

In one embodiment, with reference to FIG. 2, the comparison module 10 includes a first comparison unit 11 configured to compare the input voltage with the first voltage threshold, and the first comparison unit 11 is connected between the circuit input end (i.e., IN pin) and the control module 20.

The comparison module 10 includes a second comparison unit 12 configured to compare the input voltage with the second voltage threshold in the specified voltage threshold, and the second comparison unit 12 is connected between the circuit input end (i.e., IN pin) and the control module 20.

In some embodiments, if only the switching of the transmission for the power, the logic level signal, or the analog signal is required, only the first comparison unit may be used instead of the second comparison unit.

In some embodiments, the functions of the first comparison unit and the second comparison unit may also be implemented in an algorithmic manner using a data processing unit.

The above-mentioned first comparison unit and second comparison unit may realize the acquisition of the required comparison results in voltage, thereby providing an accurate and sufficient basis for further control.

Figure 3:
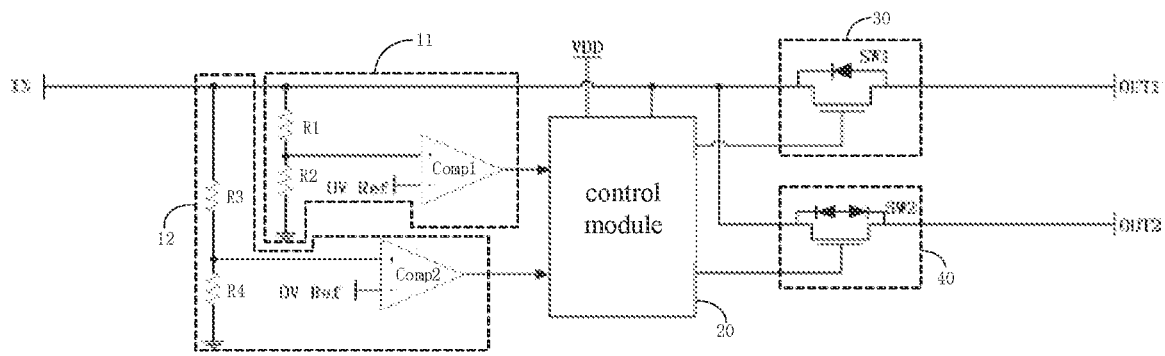
FIG. 3 is a circuit diagram of a channel circuit in another embodiment of the invention.

In a further example, with reference to FIG. 3, the first comparison unit 11 includes a first divider resistor R1, a second divider resistor R2 and a first comparator Comp1;

the first divider resistor R1 is connected between the first input end of the first comparator Comp1 and the circuit input end (i.e., IN pin), the second divider resistor R2 is connected between the first input end and the ground, and a second input end of the first comparator Comp1 is connected to a first reference voltage UV Ref corresponding to the first voltage threshold.

The first input end of the first comparator Comp1 may be a non-inverting input end, and at this time, the second input end of the first comparator Comp1 is an inverting input end; the first input end of the first comparator Comp1 may also be an inverting input end, and at the same time, the second input end of the first comparator Comp1 is a non-inverting input end.

In other examples, the divider resistor may not be used, and the IN pin may be directly connected to the first comparator Comp1.

In a further example, with reference to FIG. 3, the second comparison unit 12 includes a third divider resistor R3, a fourth divider resistor R4 and a second comparator Comp2;

the third divider resistor R3 is connected between a first input end of the second comparator Comp2 and the circuit input end (i.e., IN pin), the fourth divider resistor R4 is connected between a second input end of the second comparator Comp2 and the ground, and the second input end of the second comparator Comp2 is connected to a second reference voltage OV Ref corresponding to the second voltage threshold.

The first input end of the second comparator Comp2 may be a non-inverting input end, and at this time, the second input end of the second comparator Comp2 is an inverting input end; the first input end of the second comparator Comp2 may also be an inverting input end, and at the same time, the second input end of the second comparator Comp2 is a non-inverting input end.

In other examples, the divider resistor may not be used, and the IN pin may be directly connected to the first comparator Comp1; the first divider resistor and the second divider resistor may also be multiplexed with the third divider resistor and the fourth divider resistor.

The working process of the specific solution of the embodiment of the invention is described below with reference to FIG. 3:

The IN pin may be regarded as an external common input pin (i.e., a single contact or interface pin connected to electronic products). The OUT1 pin is configured to output the positive power input on the IN pin that meets the working voltage range of the back-end system to the back-end power system of the chip. The OUT2 pin is configured to output the analog or logic signal input on the IN pin to the corresponding post-stage circuit or system.

If an input voltage, whether it is the positive power, the analog signal, or a logic high level signal, on the IN pin is still higher than the second reference voltage OV Ref of the second comparator Comp2 after being divided by the third divider resistor R3 and the fourth divider resistor R4, the control module promptly turns off the power channel switch SW1 and the signal channel switch SW2 according to the output signal of the second comparator Comp2, thereby realizing the protection of the back-end;

If the input voltage on the IN pin is still lower than the second reference voltage OV Ref of the second comparator Comp2 after being divided by the third divider resistor R3 and the fourth divider resistor R4 and is still higher than the first reference voltage UV Ref of the first comparator Comp1 after being divided by the first divider resistor R1 and the second divider resistor R2, it is considered that the positive power voltage required for the normal operation of the system is input on the IN pin, and then the power channel switch SW1 from the IN pin to the OUT1 pin is kept in a turn-on state while turning off the signal channel switch SW2 from the IN pin to the OUT2 pin;

If the input voltage on the IN pin is still lower than the first reference voltage UV of the first comparator Comp1 after being divided by the first divider resistor R1 and the second divider resistor R2, the control module 20 promptly turns off the power channel switch SW1 according to the output signal of the first comparator Comp1, but turn on the signal channel switch SW2 at the same time, thereby sharing the IN pin but transmitting the analog or logic level within a reasonable voltage range to the back-end circuit system through the OUT2 pin;

If electronic products need to share the IN pin to realize the transmission of analog or logic level (logic high level and logic low level), a suitable working voltage will be supplied to the VDD pin, so that even if the input voltage on the IN pin is lower than the undervoltage point of the chip (i.e., the first voltage threshold), the channel from the IN pin to the OUT2 pin of the invention may continue to work normally.

It can be seen that in order to avoid the defects of the existing solutions, the specific solution of the invention has made the following improvements: 1. an extra voltage source (i.e., the voltage input from the VDD pin) is added. 2. From the IN pin to the OUT2 pin, the signal channel switch SW2 is added to optimize the design of analog and digital logic throughput, and the SW2 switch may be turned off in both directions. 3. A judgment logic for the undervoltage point is used to distinguish whether the voltage on the IN pin is the positive power required for the normal operation of the back-end or the analog and logic signals that need to be input and transmitted. In this way, the IN pin may not only support the transmission of positive power through the OUT1 pin, but also support the input transmission of analog and logic signals from the ground level (GND) to the voltage range of the undervoltage point (Under Voltage).

In addition, the configuration of the UV voltage (i.e., the undervoltage point, also the first voltage threshold) of the invention ensures that the upper limit of the analog signal voltage or the logic high level of the logic signal in the normal application of the commonly used electronic products is lower than the set UV voltage.

It should also be noted that:

Based on the requirements of practical applications, the circuit of the embodiment of the invention constructs for the first time a circuit structure of an overvoltage protection switch in which the signal and the power supply of a shared input pin are separated into two. The positive power and analog & digital signals may be input to the circuit through the same pin (i.e., IN pin), and then may be transmitted to different output pins (i.e., OUT1 pin and OUT2 pin). In comparison, there are only one-switch-to-two signal analog switches or one-switch-to-two power switches at most, and the two one-switch-to-two switches are also switched directly without distinguishing the input voltage range when switching. It can be seen that before the invention, there has never been any one-switch-to-two switches where the power and signal are input from the common terminal and then the output power and signal are separated to their respective output pins, but the invention realizes this function through the power channel switch and the signal channel switch.

In a specific solution of the invention, using the different voltage ranges on the IN pin for the logic control of turning on and off the switch is the first logic control pioneered in the specific solution of the invention, i.e., the solution fits the actual application requirements. The actual application requirements are such as: in the practical application of a large number of electronic products, the internal charging chip, and other circuits often require the voltage supplied externally to be greater than 3.6V, while for analog or digital logic communication inside electronic products, the logic high level is often 3.3V or 1.8V or lower. In this way, the specific solution of the invention cleverly utilizes the division of the voltage range on the IN pin to just separate and switch the input positive power or signal to the correct respective outputs. For example, the power output that is greater than the undervoltage point and less than the overvoltage point (i.e., the second voltage threshold) is output to the OUT1 pin to supply power to the system (while the transmission from the IN pin to the OUT2 pin is turned off); the signal below the undervoltage point (including signals in low logic level) is output to the OUT2 pin to communicate with other circuits in the system (while turning off the transmission from the IN pin to the OUT1 pin).

Further, in a specific solution of the invention, it is only necessary to optimize the performance design of the power channel from the IN pin to the OUT1 pin, and the chip circuit of the invention is powered by the IN pin to supply power when the channel is working; it is only necessary to optimize the performance design of the signal channel from the IN pin to the OUT2 pin, and the VDD pin is used to supply power to the chip circuit of the invention when the channel is working. Therefore, the application requirements of power and signal multiplexing are met, and the circuit of the invention may be designed and produced with a smaller die area, thereby reducing the cost.

An embodiment of the invention further provides an electronic device, including the channel circuit related to the first aspect and optional solutions thereof.

In the description of the specification, the reference terms "an embodiment", "example", "specific example", "an example" and the like mean that the specific characteristic, structure, material or feature described in combination with the embodiment of the example are contained in at least one embodiment or example of the present invention. In the specification, the schematic recitation of the above terms does not necessarily refer to the same embodiment or example. Furthermore, the described specific characteristic, structure, material or feature can be combined in an appropriate manner in any one or more embodiments or examples.

At last, it should be noted that the above various embodiments are only used to describe the technical solutions of the present invention, rather than limiting the technical solutions of the present invention. Even though the present invention is described in detail with reference to the foregoing embodiments, those of ordinary skilled in the art should understand that they can still modify the technical solutions recorded in the foregoing various embodiments or equivalently replace some or all of the technical features. However, these modifications or replacements do not make the essence of the corresponding technical solutions deviate from the scope of the technical solutions of the embodiments of the present invention.

What is claimed is:

1. A channel circuit comprising a power channel switch, a signal channel switch, a control module, and a comparison module, wherein
   the power channel switch is connected between a circuit input end and a first circuit output end, and the signal channel switch is connected between the circuit input end and a second circuit output end;
   the comparison module is connected to the circuit input end and is configured to compare an input voltage with a specified voltage threshold and feedback corresponding comparison results to the control module, wherein the specified voltage threshold comprises a first voltage threshold; and
   the control module is configured to control the signal channel switch to be turned on and the power channel switch to be turned off when the input voltage is lower than the first voltage threshold, and to control the signal channel switch to be turned off when the input voltage is higher than the first voltage threshold, wherein the comparison module comprises a second comparison unit configured to compare the input voltage with the second voltage threshold in the specified voltage threshold, and the second comparison unit is connected between the circuit input end and the control module.

2. A channel circuit comprising a power channel switch, a signal channel switch, a control module, and a comparison module, wherein
   the power channel switch is connected between a circuit input end and a first circuit output end, and the signal channel switch is connected between the circuit input end and a second circuit output end;
   the comparison module is connected to the circuit input end and is configured to compare an input voltage with a specified voltage threshold and feedback corresponding comparison results to the control module, wherein the specified voltage threshold comprises a first voltage threshold; and
   the control module is configured to control the signal channel switch to be turned on and the power channel switch to be turned off when the input voltage is lower than the first voltage threshold, and to control the signal channel switch to be turned off when the input voltage is higher than the first voltage threshold, wherein
   the specified voltage threshold further comprises a second voltage threshold, and the second voltage threshold is higher than the first voltage threshold; and
   the control module is further configured to control the power channel switch to be turned on when the input voltage is higher than the first voltage threshold and lower than the second voltage threshold, and to control the power channel switch to be turned off when the input voltage is higher than the second voltage threshold, wherein the comparison module comprises a second comparison unit configured to compare the input voltage with the second voltage threshold in the specified voltage threshold, and the second comparison unit is connected between the circuit input end and the control module.

3. A channel circuit comprising a power channel switch, a signal channel switch, a control module, and a comparison module, wherein
   the power channel switch is connected between a circuit input end and a first circuit output end, and the signal channel switch is connected between the circuit input end and a second circuit output end;
   the comparison module is connected to the circuit input end and is configured to compare an input voltage with a specified voltage threshold and feedback corresponding comparison results to the control module, wherein the specified voltage threshold comprises a first voltage threshold; and
   the control module is configured to control the signal channel switch to be turned on and the power channel switch to be turned off when the input voltage is lower than the first voltage threshold, and to control the signal channel switch to be turned off when the input voltage is higher than the first voltage threshold, wherein
   the specified voltage threshold further comprises a second voltage threshold, and the second voltage threshold is higher than the first voltage threshold; and
   the control module is further configured to control the power channel switch to be turned on when the input voltage is higher than the first voltage threshold and lower than the second voltage threshold, and to control the power channel switch to be turned off when the input voltage is higher than the second voltage threshold, wherein the second voltage threshold is an overvoltage protection voltage threshold, and the first voltage threshold is an undervoltage protection voltage threshold, wherein the comparison module comprises a second comparison unit configured to compare the input voltage with the second voltage threshold in the specified voltage threshold, and the second comparison unit is connected between the circuit input end and the control module.

4. A channel circuit comprising a power channel switch, a signal channel switch, a control module, and a comparison module, wherein
   the power channel switch is connected between a circuit input end and a first circuit output end, and the signal channel switch is connected between the circuit input end and a second circuit output end;
   the comparison module is connected to the circuit input end and is configured to compare an input voltage with a specified voltage threshold and feedback corresponding comparison results to the control module, wherein the specified voltage threshold comprises a first voltage threshold; and
   the control module is configured to control the signal channel switch to be turned on and the power channel switch to be turned off when the input voltage is lower than the first voltage threshold, and to control the signal channel switch to be turned off when the input voltage is higher than the first voltage threshold, wherein the specified voltage threshold further comprises a second voltage threshold, and the second voltage threshold is higher than the first voltage threshold; and the control module is further configured to control the power channel switch to be turned on when the input voltage is higher than the first voltage threshold and lower than the second voltage threshold, and to control the power channel switch to be turned off when the input voltage is higher than the second voltage threshold, wherein the second voltage threshold is an overvoltage protection voltage threshold, and the first voltage threshold is an undervoltage protection voltage threshold, wherein the signal channel switch is a bi-directional switch, wherein the comparison module comprises a second comparison unit configured to compare the input voltage with the second voltage threshold in the specified voltage threshold, and the second comparison unit is connected between the circuit input end and the control module.

5. The channel circuit according to claim 1, wherein the second comparison unit comprises a third divider resistor, a fourth divider resistor, and a second comparator;

the third divider resistor is connected between a first input end of the second comparator and the circuit input end, the fourth divider resistor is connected between a second input end of the second comparator and the ground, and the second input end of the second comparator is connected to a second reference voltage corresponding to the second voltage threshold.

* * * * *